United States Patent [19]
Kase

[11] Patent Number: 5,465,850
[45] Date of Patent: Nov. 14, 1995

[54] INTEGRATED CIRCUIT TEST SYSTEM

[75] Inventor: Seiichi Kase, Tokyo, Japan

[73] Assignee: NEC Corporation, Japan

[21] Appl. No.: 27,239

[22] Filed: Mar. 5, 1993

[30] Foreign Application Priority Data

Mar. 11, 1992 [JP] Japan ................... 4-052106

[51] Int. Cl.⁶ ............................ B07C 5/344; G01R 15/00
[52] U.S. Cl. ........................... 209/573; 324/759; 324/764
[58] Field of Search ..................... 209/552, 571, 209/573; 324/73.1, 158 F, 754, 763, 764, 765, 759

[56] References Cited

U.S. PATENT DOCUMENTS

| | | | |
|---|---|---|---|
| 4,517,512 | 5/1985 | Petrich et al. | 324/158 F X |
| 4,997,522 | 3/1991 | Schlinkmann et al. | 209/573 X |
| 5,032,789 | 7/1991 | Firooz et al. | 324/158 F X |
| 5,151,650 | 9/1992 | Frisbie et al. | 209/573 X |
| 5,227,717 | 7/1993 | Tsurishima et al. | 324/158 F |
| 5,315,237 | 5/1994 | Iwakura et al. | 324/754 |

FOREIGN PATENT DOCUMENTS 9204989  4/1992  WIPO ......................... 324/158 F

Primary Examiner—William E. Terrell
Assistant Examiner—Tuan Nguyen
Attorney, Agent, or Firm—Laff, Whitesel, Conte & Saret, Ltd.

[57] ABSTRACT

An integrated circuit test system tests a plurality of integrated circuit devices which are classified by an auto-handler. The test system comprises a test board for receiving the device under test, circuit tester for carrying out the tests, an auto-handler for mounting, demounting and classification the devices based on the test results. Individual test result signals are related to the respective individual devices. Equipment on the test board correspond to the respective devices and transmit both an individual existence signal and a device identification signal synchronized with the individual test result signal. The device identification signal identifies the individual information signal as being related to a particular device, in order to avoid an error in classification of the device by the auto-handler irrespective of possible wrong connections and of the order of the transmission of the individual test result signals.

7 Claims, 6 Drawing Sheets

INTEGRATED CIRCUIT TEST SYSTEM

FIELD OF THE INVENTION

The present invention relates to an integrated circuit test system, and more particularly to an integrated circuit test system in which integrated circuit devices subjected to a test are classified and stored by an auto-handler based on the test result of the electric characteristics of the integrated circuit devices.

BACKGROUND OF THE INVENTION

Such an integrated circuit test system is known in which a plurality of integrated circuit devices are tested simultaneously in parallel on the electric characteristics thereof. A conventional integrated circuit test system comprises an integrated circuit tester (referred to as a circuit tester hereinafter), a test board for receiving each of integrated circuit devices under test (referred to as DUTs hereinafter) at a receiving member or a socket portion thereof, and an auto-handler for mounting and demounting the DUTs.

Information signals are exchanged between the circuit tester and the auto-handler during a test sequence for a subsequent automated classification of DUTs by the auto-handler. A plurality of DUTs are mounted to respective sockets of receiving members on the test board by respective handling members each mounted on the auto-handler. The auto-handler supplies a signal for information related to existence of DUTs (referred to as an existence information signal SDUT hereinafter) to the circuit tester through an interface cable disposed between the circuit tester and the auto-handler after mounting the DUTs on the receiving members. The existence information signal SDUT includes individual existence signals for the information whether or not each of the individual receiving members is provided with a DUT.

The circuit tester carries out electrical measurements at the signal lines of the receiving members which are provided with DUTs, on the basis of the existence information signal SDUT. After the measurements of the electric characteristics are finished, a signal for information related to the test results (referred to as a result information signal SJ hereinafter) is transferred from the circuit tester to the auto-handler through the interface cable. The result information signal SJ includes individual result signals for the information of test results of the individual DUTs.

The auto-handler then operates classification and storage of the tested DUTs on the basis of the result information signal SJ. Although there are other information to be exchanged and other several signals such as synchronizing signals in the test system, the classification and the subsequent storage are carried out, in principle, on the basis of the alternate exchange of the existence information signal SDUT and the result information signal SJ as described above.

An integrated circuit test system, in which a number of DUTs are tested simultaneously in parallel, usually employs a controller such as a GP-IB (IEEE-488) controller for transmitting the information signals between the circuit tester and the auto-handler, the GP-IB enabling transmission of many information signals simultaneously through a limited number of signal transmission lines.

With a conventional test system employing, for example, GP-IB controller, the receiving member disposed on the test board must be numberred beforehand for a correct transmission of the existence information signal SDUT and the result information signal SJ. The numberring of DUTs, e.g. DUT1 to DUTn, must be uniformed in the test system, i.e. the numberring of the handling members employed in the auto-handler must be consistent with the numberring of the corresponding DUTs employed in the circuit tester.

After DUTs are mounted on the receiving members of the test board by the auto-handler, the auto-handler supplies the circuit tester with an existence information signal. The existence information signal is exemplified in FIG. 1, which shows a three-byte existence information signal SDUT related to the test board shown in FIG. 2. FIG. 2 shows, as an example, a test board i in which DUT1, DUT2, DUT4, DUT5, DUT7 and DUT8 are actually provided on the respective receiving members among all of the 1st to 8th receiving members.

GP-IB controller usually employs 8-bit signals, the lower four bits of which represent the content of the data. Hence, transmission of the existence information signal requires 3-bite signal as shown in FIG. 1. The first byte of FIG. 1 declares that this signal is related to an existence information signal SDUT, the second and the third bytes represent the actual existence information as to the individual eight receiving members.

When the circuit tester receives the existence information signal SDUT of FIG. 1, the circuit tester understands the content of the existence information based on the received signal and the predetermined format of the signal transmission, then starts electric measurements of the individual DUTs which are informed as existing on the receiving members in the existence information signal SDUT.

After the electric measurement of each of the DUTs then present on the test board is completed, the circuit tester supplies the auto-handler with a result information signal SJ as shown in FIG. 3 through the interface cable. The result information signal SJ includes nine bytes, first of which declares that the signal is a result information signal SJ and the rest of which show the individual test results thereof. In this example, since each of the individual test result signals SJa to SJh is constituted by a 4-bit signal, the individual result information can be categorized in sixteen classifications.

When the auto-handler receives the result information signal SJ of FIG. 3 from the circuit tester, the auto-handler understands the test results of the individual DUTs represented by the individual test result signals SJa to SJh on the basis of the received signal and the predetermined format, then starts for classification and storage operation with its handling members.

Upon a parallel measurement of a plurality of DUTs in a conventional test system as described above, the numberring of DUTs on the test board by the circuit tester must be consistent with the numberring of the corresponding handling members by the auto-handler for a correct transmission of the information signals. An error, however, sometimes occurs in the numberring between the circuit tester and the auto-handler, due to an inconsistency of the numberring format between the test board and the auto-handler or due to a wrong connections between the test board and the circuit tester. Such an error would lead to a problem of a miss classification resulting in, for example, a shipment of a defective integrated circuit device.

SUMMARY OF THE INVENTION

An object of the present invention is to eliminate the drawback as described above in the conventional test system, and to provide an integrated circuit test system in which a reliable classification can be obtained with a limited increase of the signal transmission member.

According to the present invention there is provided an integrated circuit test system comprising: a test board having a plurality of receiving members each for receiving a device under test and a set of measurement signal lines connected to said device; a circuit tester for supplying measurement signals and receiving resultant signals through said measurement signal lines for obtaining individual test results of respective said devices; an auto-handler for classifying said devices based on respective said test results; first transmission means for transmitting signals of said test results in sequence from said circuit tester to said auto-handler; second transmission means disposed correspondingly to respective said receiving members, said second transmission means each transmitting a device identification signal corresponding to each of said devices from said circuit tester to said auto-handler through said test board, with said device identification signals being synchronized with respective said signals of said individual test results.

Each of the second transmission means may transmit a corresponding individual existence signal additionally to the device identification signal before the test execution.

According to an integrated circuit test system of the present invention, since the device identification signal corresponding to a particular receiving member and synchronized with the individual test result signal is transmitted through the second transmission means, the auto-handler can recognize correctly each of the individual test results as related to the particular tested device. Hence, numberring of the DUTs is not necessary for a correct transmission of the result information signal, so that reliable classification by the auto-handler can be obtained.

When the second transmission means transmits the individual existence signal to the circuit tester before the test execution, further reliable classification by the auto-handler can be obtained, since an error in connection between the receiving member and the circuit tester can be found and corrected during the transmission of the result information signal. It is sufficient that a portion of the second transmission means transmits both of the individual existence signal and the device identification signal.

BRIEF DESCRIPTION OF THE DRAWINGS

Other and further objects, features and advantages of the present invention will be more apparent from the following description, referring to the accompanying drawings in which.

DESCRIPTION OF THE PREFERRED EMBODIMENTS

Figure 1:
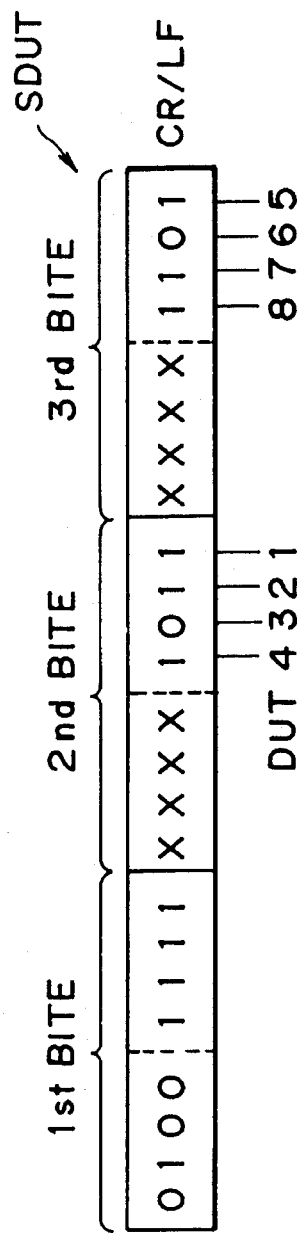
FIG. 1 is a table showing an example of bit configuration representing an existence information signal of DUTs in a conventional integrated circuit test system.
Figure 2:
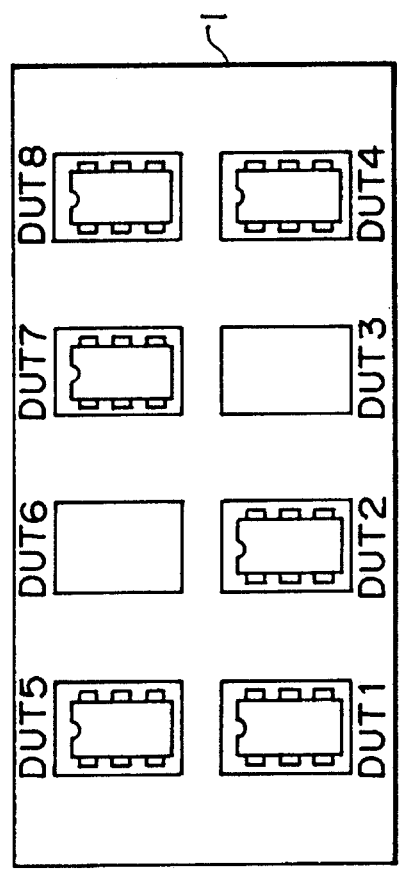
FIG. 2 is a top plan view of a test board for showing an arrangement of DUTs to which the existence information of FIG. 1 relates.
Figure 3:
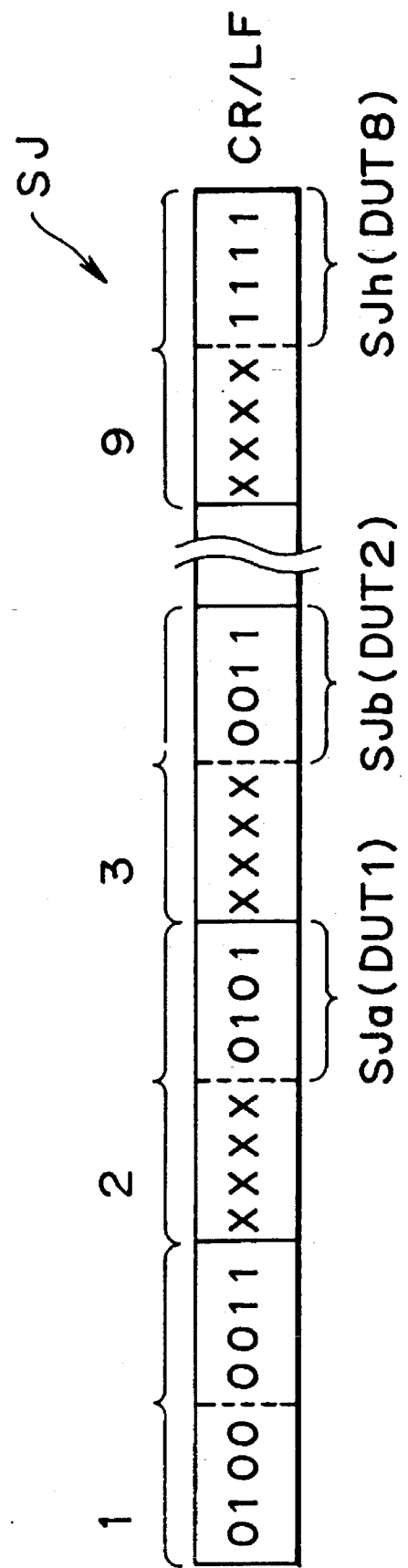
FIG. 3 is a table showing a bit configuration in a result information signal of DUTs disposed on the test board of FIG. 2.
Figure 4:
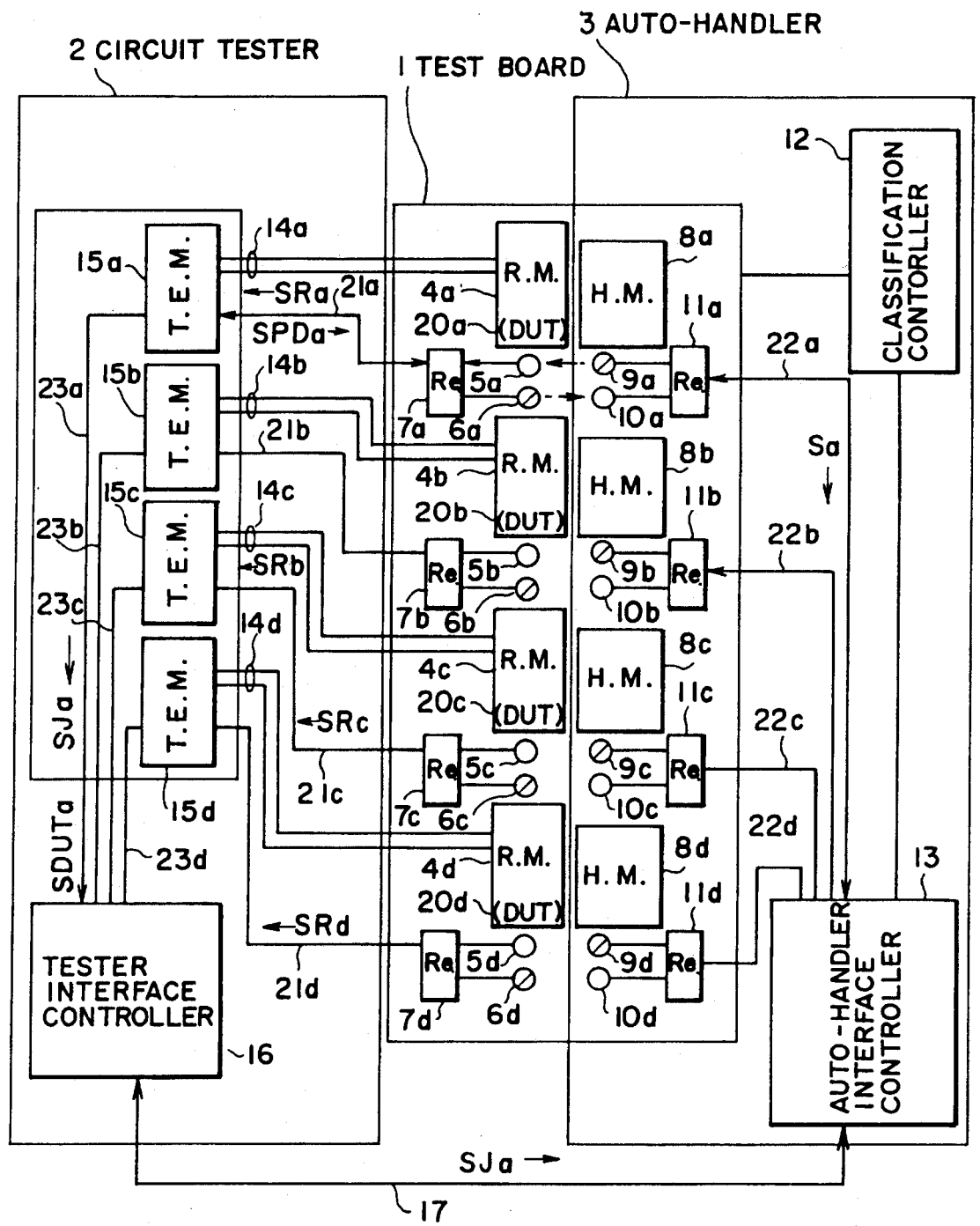
FIG. 4 is a block diagram showing an integrated circuit test system according to an embodiment of the present invention.

Turning now to FIG. 4, there is shown an integrated circuit test system according to an embodiment of the present invention. The test system of FIG. 4 comprises: a test board 1 carrying four receiving members (R.M.) 4a to 4d each including a mounting socket for a DUT; a circuit tester having four test execution members (T.E.M.) 15a to 15d corresponding to the receiving members 4a to 4d, respectively, and a tester interface controller 16; and an auto-handler 3 having four handling members (H.M.) 8a to 8d corresponding to the receiving members 4a to 4d for mounting and demounting DUTs on the respective receiving members, a classification controller 12 and a auto-handler interface controller 13.

The tester interface controller 16 and the auto-handler interface controller 13 disposed respectively on the circuit tester 2 and the auto-handler 3 are connected to each other through an interface cable 17 constituting first transmission means.

The mounting sockets of the receiving members 4a to 4d are provided with DUTs 20a to 20d, respectively, and adjacent to the sockets there are provided photo-transistors 5a to 5d and light-emitting diodes 6a to 6d corresponding to the respective sockets 4a to 4d. Each of the receiving members 4a to 4d has a respective set of measurement signal lines 14a to 14d for detachably connecting the mounting socket with one of the test execution members 15a to 15d thereby transmitting measurement signals and resultant signals between the DUTs 20a to 20d and respective test execution members 15a to 15d.

The photo-transistor 5a and the light-emitting diode 6a, for example, are changed over by a corresponding relay 7a during a test sequence. Hence, the output signal or input signal of the photo-transistor 5a or light emitting diodes 6a is transmitted to or from the test execution member 15a through a signal line 21a. As to the other photo-transistors 5b to 5d and the light-emitting diodes 6b to 6d are similarly changed over by respective relays 7b to 7d for transmission of the signals during the test sequence.

The auto-handler 3 is also provided with light-emitting diodes 9a to 9d and photo-transistors 10a to 10d adjacent to and corresponding to the handling members 8a to 8d. Relays 11a to 11d are also mounted on the auto-handler 3 for controlling the light-emitting diodes 9a to 9d and photo-transistors 10a to 10d. In FIG. 4, control circuits disposed for controlling the photo-transistors, light-emitting diodes and the relays are not shown for simplification of the drawing. The light-emitting diodes, photo-transistor, relays and signal lines thereof constitute second transmission means.

When the test board 1 is mounted or attached to the auto-handler 3, each of the light-emitting diodes is located correspondingly to the location of a corresponding photo-transistor. Hence, predetermined optical coupling is obtained only by mounting or attaching the test board 1 to the auto-handler 3. Namely, the light-emitting diodes 9a to 9d are optically coupled to the photo-transistor 5a to 5d, respectively, while the photo-transistors 10a to 10d are optically coupled to the light-emitting diodes 6a to 6d, respectively.

The input and output signals of the relays 11a to 11d are supplied from and to the auto-handler interface controller 13 on the auto-handler 3 through the respective signal lines 22a to 22d.

Now the operation of the above embodiment will be described beginning with transmission of the existence information signal SDUT from the auto-handler 3 to the circuit tester 2. When a DUT 20a is mounted on the testing member 4a by the handling member 8a of the auto-handler 3, the light-emitting diode 9a disposed adjacent to the handling member 8a emits a signal light due to a device-existing signal generated by, for example, limit switch (not shown) detecting the DUT 20a. Alternatively, such a signal may be generated by the respective handling members 8a to 8d when these members operate for mounting the respective devices.

The photo-transistor 5a disposed adjacent to the receiving member 4a on the test board 1 receives the signal light emitted by the light-emitting diode 9a, and transmits the individual existence signal to the relay 7a which in turn transmits the individual existence signal SRa to the test execution member 15a. The test execution member 15a in turn transmits the individual existence signal SDUTa to the tester interface controller 16 through the signal line 23a. The similar operation is carried out as to the other DUTs 20b to 20d mounted on the sockets for testing in parallel at the same time as the DUT 20a.

Next, transmission of the result information signal SJ from the circuit tester 2 to the auto-handler 3 will be described. After the electric measurements of all of the DUTs then mounted on the receiving members 4a to 4d are finished, individual test result signals SJa to SJd, which are generated in the test execution members 15a to 15d, are supplied to the tester interface controller 16.

The tester interface controller 16 functions synchronizing the result information signal SJ with a reference clock signal. When the tester interface controller 16 first transmits an individual test result signal SJa of the first receiving member 4a among all receiving members 4a to 4d through the interface cable 17, the tester interface controller 16 transmits at the same time a driving signal SPDa for the light-emitting diode 6a to the test execution member 15a, which in turn drives the light-emitting diode 6a adjacent to the receiving member 4a on the test board 1 through the signal line 21a. Hence, the signal line 21a of the second transmission means functions for transmitting both the individual existence signal SJa and the driving signal SPDa.

The photo-transistor 10a of the auto-handler 3 receives the light emitted by the light-emitting diode 6a, and supplies an active signal Sa corresponding to the driving signal SPDa to the auto-handler interface controller 13 via the relay 11a. The auto-handler interface controller 13 receives both the active signal Sa from the photo-transistor 10a and the individual result signal SJa through the test interface cable 17. Hence, the auto-handler interface controller 13 recognizes that the individual result information signal then transmitted thereto is the individual test result signal SJa of the particular DUT 20a mounted on the receiving member 4a.

The simultaneous transmissions of both the individual test result signals SJa to SJd and the respective active signals Sa to Sd are carried out in four cycles for all of the individual result information signals SJa to SJd. The order of the transmission, however, may be selected at random so long as the corresponding signals are transmitted simultaneously from the tester interface controller 16. The auto-handler interface controller 13 supplies all of the individual test result signals SJa to SJd to the classification controller 12, which functions for classification and storage of the DUTs through operating a classification and storage mechanism not shown in FIG. 4 on the basis of the individual test result signals of the DUTs.

The individual existence signals SRa and the respective driving signals SPDa are transmitted by the same signal line 21a. Thus, even if both of the signal line 21a and measurement signal lines 14a are connected to a wrong test execution member, for example 15b, the result information signal SJa is correctly recognized by the auto-handler interface controller 13 as related to the DUT 20a. Hence, a correct transmission of the result information signal can be obtained irrespective of the connection between the receiving member and the test execution member.

Figure 5:
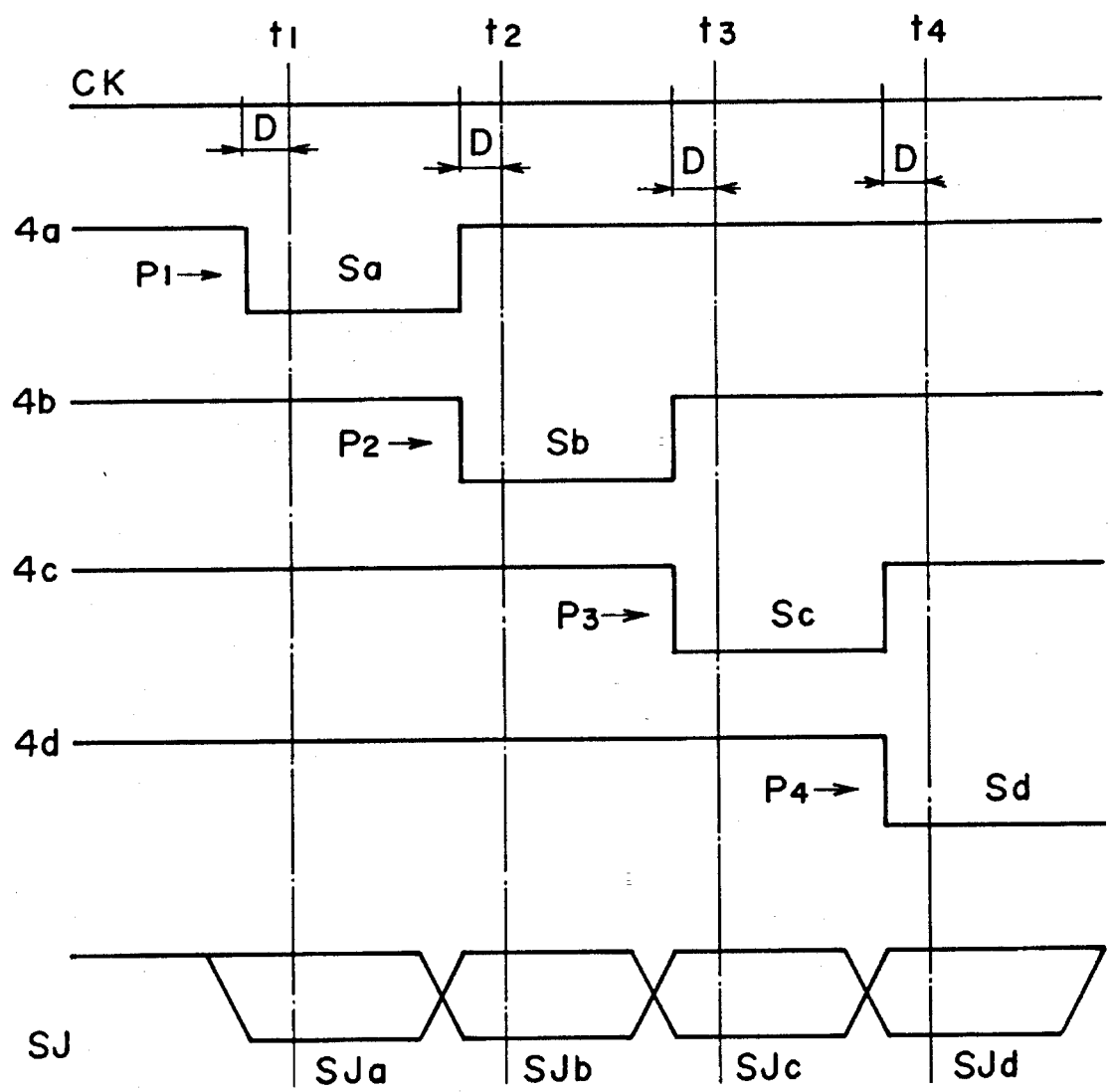
FIG. 5 is a timing chart of the signals for showing operation of the test system of FIG. 4.

FIG. 5 shows a timing chart for the transmission of the signals as described above. During the first cycle as to the transmission of the result information signal SJ, a particular existence signal SJa is transmitted simultaneously with an active signal or a DUT identification signal Sa forwarded by the tester interface controller 16, so that the auto-handler interface controller 13 recognizes the individual result signal SJa as related to the DUT 20a, and latches the individual result signal SJa at the time t1 which is delayed from the occurring of the reference clock pulse P1 by a predetermined delay D. During each of the subsequent cycles, each of individual result signals SJb to SJd is transmitted simultaneously with the corresponding one of the DUT identification signals Sb to Sd for a correct transmission.

Figure 6:
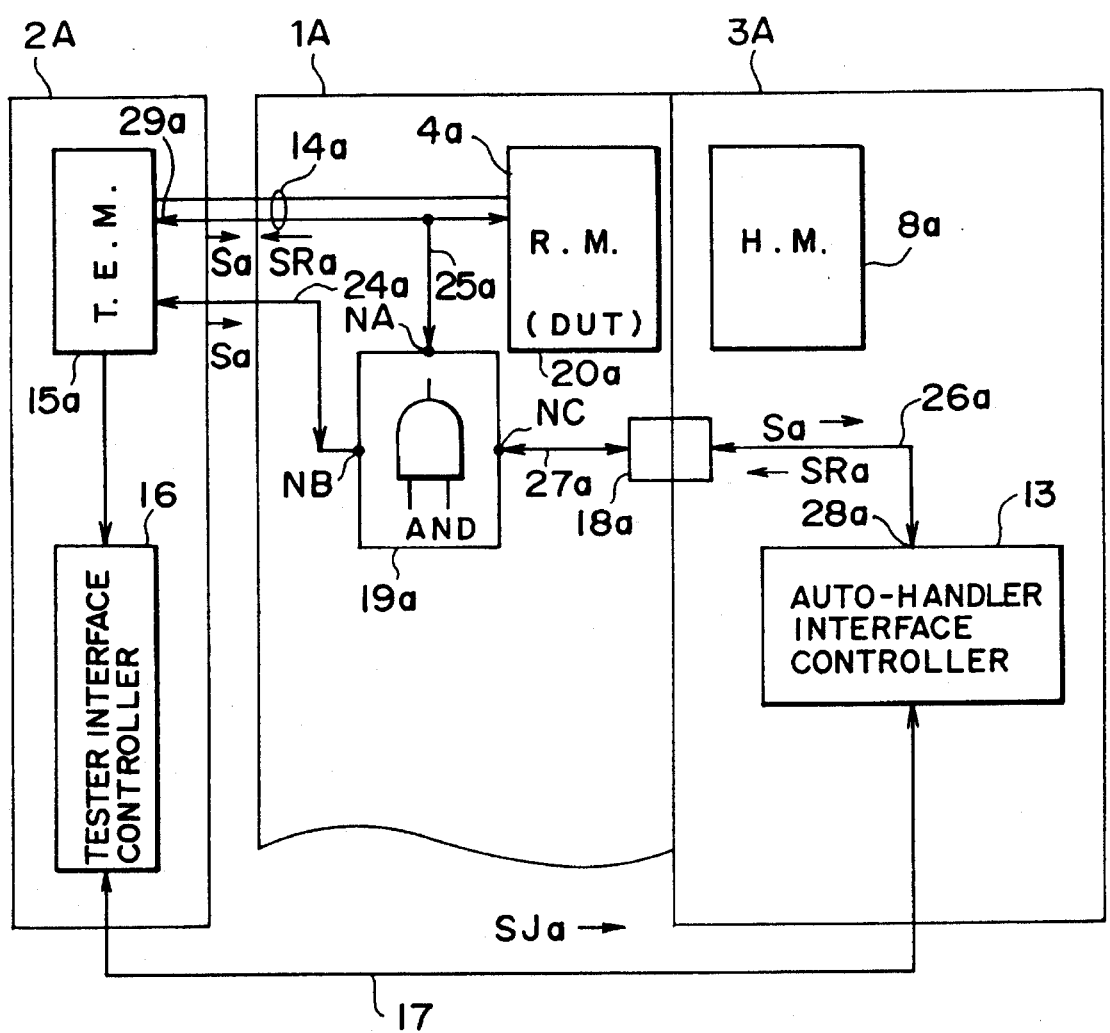
FIG. 6 is a block diagram showing an integrated circuit test system according to another embodiment of the present invention.

FIG. 6 shows an integrated circuit test system according to another embodiment of the present invention, in which only one channel related to "a" receiving member is exemplified. The other channels "b" to "d" are similar to the "a" channel as is in the case of the first embodiment of FIG. 4.

The test system of FIG. 6 comprises a connector assembly 18a, an AND circuit 19a and signal lines 24a to 27a as a second transmission means instead of the light-emitting diodes 6a, 9a, the photo-transistors 5a, 10a and the signal lines thereof in the embodiment of FIG. 4. When the test board 1A is mounted to the auto-handler 3A, the plug member and the socket member of the connector assembly 18a are coupled together.

The auto-handler interface controller 13 and test execution member 15a have I/O terminals 28a and 29a, respectively, each of which functions both for supplying and receiving signals. The I/O terminals 28a and 29a are controlled during a test sequence to supply or to receive the signals therethrough. The I/O terminal 28a of the auto-handler interface controller 13 is connected through the signal lines 26a, the connector assembly 18a and signal line 27a to a terminal NC of the AND circuit 19a, another terminal NA of which is connected to a branch 25a of a particular signal line of the measurement signal lines 14a, such as a bias power line, connected to the I/O terminal 29a.

The last terminal NB of the AND circuit 19a is connected to the test execution member 15a of the circuit tester 2A through the signal line 24a. Each of the terminals NA and NC is implemented by an I/O terminal for supplying and receiving signals, and can be controlled during the test sequence. The terminal NC functions for receiving signals during the transmission of the existence information signal SDUT, and the AND of the signals inputted to the terminals NB and NC is outputted through the terminal NA. On the other hand, the terminal NA functions for receiving signals during the transmission of the result information signal SJ, and the AND of the signals inputted to the terminals NA and NB is outputted through the terminal NC.

Figure 7:
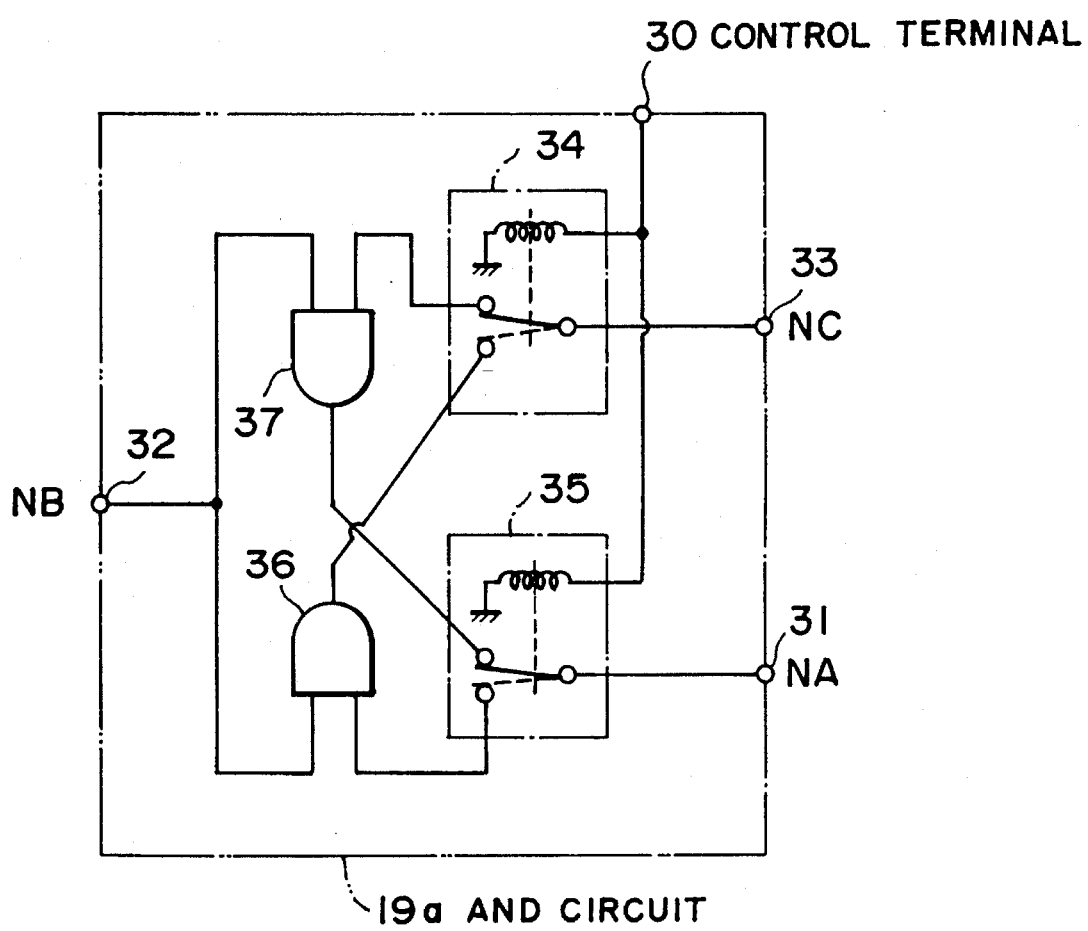
FIG. 7 is a schematic diagram showing a configuration of the AND circuit of FIG. 6 as an example.

FIG. 7 shows a schematic configuration of an example of the AND circuit of FIG. 6 in which a control terminal 30, two relays 34 and 35, and two AND gates are provided for controlling the terminals NA and NC. The relays may be replaced by analog switches. When the control terminal 30 is set at 0 during the transmission of the existence information signal, the terminal NA functions for an output terminal and the terminal NC functions for an input terminal as shown by solid lines. When the control terminal 30 is set at 1 during the transmission of the result information signal, the terminal NA functions for an input terminal and the terminal NC functions for an output terminal as shown by dotted lines.

Now, transmission of the existence information signal SDUT in the test system of FIG. 6 is described. When a DUT is mounted on the receiving member 4a, the auto-handler interface controller 13 supplies an individual existence signal SRa of the DUT 20a to the terminal NC of the AND circuit 19a through the connector assembly 18a. Since the terminal NB is set at 1 by the test execution member 15a during the transmission of the existence information signal, the terminal NA outputts the active signal SRa so long as DUT 20a is actually mounted. The transmission of the individual existence signals can be carried out simultaneously for all of the DUTs to be tested in parallel, so that each of the testing members recognizes whether or not a DUT is mounted on the corresponding receiving member.

Next, transmission of the result information signal SJ will be described. After the electric measurements of all of the DUTs are finished, the test interface controller 16 first transmits result information signal SJa to the auto-handler interface controller 13 through the interface cable 17, and at the same time supplies the active signals Sa to the terminal NB and to the terminal NA of the AND circuit 19a through the signal lines 24a and 25a, respectively.

Hence, the AND circuit 19a supplies an active signal Sa through the terminal NC to the auto-handler interface controller 13 via the connector assembly 18a. The auto-handler interface controller is recognizes the result information signal then transmitted from the tester interface controller 16 as the individual result signal SJa of the first DUT 20a by way of the active signal or the device identification signal Sa.

The transmission of the individual result signals SJa to SJd are carried out in sequence for DUTs tested in parallel. The order of transmission of the individual result signals SJa to SJd by the tester interface controller 16 may be at random however.

With the second embodiment, if one of the signal lines of the second transmission means for transmitting the active signals from the respective test execution members is connected to a wrong receiving member, the error connection can be detected due to the AND circuit 19a, since the active signal Sa cannot be transmitted to the auto-handler interface controller 13 in this situation.

Besides, since the numberring of DUTs is not necessary for a correct transmission of the existence information signal and the result information signal, the measurement signal lines of each of the receiving member can be connected to any test execution member, so that the test can be carried out in such a way that a limited length of the measurement signal lines will not act a restriction for connection working and wrong connection is easily corrected without an error in the classification.

Since above embodiments are described only for examples, the present invention is not limited to such embodiments and it will be obvious for those skilled in the art that various modifications or alterations can be easily made based on the above embodiments under the scope of the invention.

What is claimed is:

1. An integrated circuit test system comprising: a test board having a plurality of receiving members each for receiving a device under test and a set of measurement signal lines connected to said device; a circuit tester for supplying measurement signals and receiving resultant signals through said measurement signal lines for obtaining individual test results of respective ones of said devices; an auto-handler for classifying said devices based on respective ones of said test results; first transmission means for transmitting signals of said test results in sequence from said circuit tester to said auto-handler; second transmission means disposed correspondingly to respective ones of said receiving members, said second transmission means transmitting an individual device identification signal corresponding to each of said devices from said circuit tester through said test board to said auto-handler, said device identification signals being synchronized with said respective signals of said individual test results.

2. An integrated circuit test system as defined in claim 1 wherein said second transmission means each transmits an individual existence signal from said auto-handler to said circuit tester before said testing, each of said individual existence signal being related to the existence information of said device received by said receiving member.

3. An integrated circuit test system as defined in claim 1 wherein said second transmission means each includes light emitting and receiving devices which are optically coupled to each other when said test board and said auto-handler are coupled to each other.

4. An integrated circuit test system as defined in claim 1 wherein said second transmission means each includes a connector assembly which is coupled when said test board and said auto-handler are coupled to each other.

5. An integrated circuit test comprising: a test board having a plurality of receiving members each for receiving a device under test and a set of measurement signal lines connected to said device; a circuit tester for supplying measurement signals and receiving resultant signals through said measurement signal lines for obtaining individual test results of respective ones of said devices; an auto-handler for classifying said devices based on respective ones of said test results; first transmission means for transmitting signals of said test results in sequence from said circuit tester to said auto-handler; second transmission means disposed correspondingly to respective ones of said receiving members and said second transmission means each including an AND circuit having bifunctional input and output terminals for transmitting an individual existence signal from said auto-handler to said circuit tester and a device identification signal corresponding to each of said devices from said circuit tester through said test board to said auto-handler, each of said individual existence signal being related to the existence information of said device received by said receiving member, said device identification signals being synchronized with respective said signals of said individual test results.

6. An integrated circuit test system as defined in claim 5 wherein at least one of said measurement signal lines functions for transmitting said individual existence signal.

7. An integrated circuit test system as defined in claim 5 wherein at least one of said measurement signal lines transmits another device identification signal to be ANDed with said device identification signal in said AND circuit.

* * * * *